(12) United States Patent
Ohtsuka et al.

(10) Patent No.: US 6,507,509 B1
(45) Date of Patent: Jan. 14, 2003

(54) NONVOLATILE MEMORY

(75) Inventors: Youichi Ohtsuka, Chiba (JP); Junichi Sone, Tokyo (JP); Jaw-Shen Tsai, Tokyo (JP); Takanari Yasui, Ibaraki (JP); Yasunobu Nakamura, Tokyo (JP)

(73) Assignees: Japan Science and Technology Corporation, Saitama (JP); NEC Corporation, Tokyo (JP)

( * ) Notice: Subject to any disclaimer, the term of this patent is extended or adjusted under 35 U.S.C. 154(b) by 0 days.

(21) Appl. No.: 09/856,913

(22) PCT Filed: Sep. 8, 2000

(86) PCT No.: PCT/JP00/06159

§ 371 (c)(1),
(2), (4) Date: Aug. 17, 2001

(87) PCT Pub. No.: WO01/26156

PCT Pub. Date: Apr. 12, 2001

(30) Foreign Application Priority Data

Sep. 30, 1999 (JP) ............................................. 11-277907

(51) Int. Cl.$^7$ ............................................. G11C 11/22
(52) U.S. Cl. ................................... 365/145; 365/200
(58) Field of Search ........................ 365/145, 65, 200; 357/23.5; 438/157; 395/24; 257/295

(56) References Cited

U.S. PATENT DOCUMENTS

| | | | |
|---|---|---|---|
| 5,146,299 A | * | 9/1992 | Lampe et al. ............... 327/23.5 |
| 5,519,812 A | * | 5/1996 | Ishihara ....................... 395/24 |
| 5,969,380 A | * | 10/1999 | Seyyedy ..................... 257/295 |
| 6,140,163 A | * | 10/2000 | Gardner et al. ............. 438/157 |
| 6,205,048 B1 | * | 3/2001 | Lee ............................. 365/145 |
| 2002/0054522 A1 | * | 5/2002 | Inoue et al. ................. 365/200 |

FOREIGN PATENT DOCUMENTS

| JP | 8-64803 | 3/1996 |
|---|---|---|
| JP | 10-41502 | 2/1998 |

* cited by examiner

*Primary Examiner*—David Nelms
*Assistant Examiner*—Thinh Nguyen
(74) *Attorney, Agent, or Firm*—Young & Thompson

(57) ABSTRACT

High device reliability, a reduction in power consumption, and a high operation speed are achieved. When a predetermined bias voltage is applied between a source 1 and a drain 2 to change a gate voltage, a current discretely flows between the source 1 and the drain 2 in accordance with quantized electrostatic energy levels in an island electrode 3. The switching ON/OFF of the current between the source 1 and the drain 2 in this case is enabled by applying ½-electron charge to a gate. When the gate voltage induces polarization in a ferroelectric layer 6, its electric field is applied to the island electrode 3. The current between the source 1 and the drain 2 in this case can be measured with high sensitivity. Charge holding is carried out by the polarization in the ferroelectric layer 6, and stored data can be held even if power supply is cut off.

30 Claims, 8 Drawing Sheets

NONVOLATILE MEMORY

TECHNICAL FIELD

The present invention relates to a non-volatile memory, and more particularly to a single electron transistor memory, which uses a ferroelectric layer for a gate portion.

BACKGROUND OF THE INVENTION

FIG. 8 shows in section the structure of a conventional single electron transistor memory. Specifically, FIG. 8 shows one of the examples of the successful use of a single electron transistor as a non-volatile memory device, which is constructed in a manner that a floating electrode 81 is disposed on the plane of a substrate between the single electron transistor and its gate (see Appl. Phys. Lett. 71, 2038, 1997, by Chen et al., Appl. Phys. Lett. 68, 1377 (1996) by S. Tiwari et al., and Tech. Dig. Int. Electron Devices Meet., 541 (1993) by L. Guo et al.). Such a memory operates reading/writing by using the electron emission of Fowler-Nordheim type (FN). Its structure is characterized by easy storage of data even at the high temperature of the memory.

For the writing operation, first, a voltage between a source 1 and a drain 2 is et at 0, then a voltage is applied to a gate electrode 7, and F/N electron emission is started when a predetermined voltage or higher is reached. Accordingly, a gate electric field is generated between the floating electrode 81 and an island electrode 3, and a current between the source 1 and the drain 2 is controlled. For the reading operation, first, electrons are tunneled through insulating layers 4 and 5 when a bias voltage is applied between the source 1 and the drain 2, and stored in the island electrode 3. By measuring a current between the source 1 and drain 2 at this time, stored information can be read with high sensitivity, due to single electron tunneling through quantized energy levels in the island.

SUMMARY OF THE INVENTION

However, the FN electron emission needs a relatively high electric field intensity because of the tunneling of electrons through a barrier layer between the gate and the floating electrode. Consequently, power consumption is increased, and deterioration inevitably occurs because of electric field stress applied on the barrier layer, thereby putting a limit on the number of rewriting times. In addition, conventionally, a relatively large resistance component has placed a limit on a response speed (about ms). In other words, since the conventional single electron memory is operated by tunneling the electrons through the gate insulating film, it has been difficult to achieve high device reliability, reduce power consumption, attain a high operation speed, and so on.

The object of the present invention is to achieve high device reliability, reduce power consumption, and attain a high-speed operation by realizing a device operation, which prevent the tunneling phenomenon of electrons through a gate insulating film by using a ferroelectric layer for a gate portion.

More specifically, the objects of the invention are as follows.

To realize a high-speed operation at the polarization response of an atomic order, by using the polarization of the ferroelectric layer as memory writing/erasing means.

To realize an operation using a very small amount of electrons and consuming lower power, by using a single electron transistor for reading electrons.

To provide high durability (mainly decided by the durability of the ferroelectric layer) and greatly reduce a device size, by eliminating the necessity of electrons tunneling through a gate insulating film.

To facilitate and simplify a manufacturing process compared with an Si ferroelectric memory process, by using an established semiconductor manufacturing method (3-layer resist and 3-angle aluminum (Al) deposition (see Jpn. J. Appl. Phys. 35, 1465 (1996) by Y. Nakamura et al.), or the like) so as to eliminate the necessity of precise control of an insulating film (thickness/horizontal direction), preventing the quality of a deposited Al electrode from being affected from its layered surface.

To screen the increase of a gate capacity caused by a high dielectric constant of a ferroelectric film, by providing a Low-k layer ($SiO_2$) as a gate layer structure.

To enhance the flatness/crystallinity of a ferroelectric layer by using ferroelectric layer growth on a lower gate metal electrode.

To prevent the thermal diffusion of a ferrorlectric component to Si in the heat treatment process of the ferroelectric layer by providing a diffusion barrier layer.

To increase the degree of device integration by employing a layered structure.

According to the invention, to achieve the above-noted objects, mainly a ferroelectric layer is used for the electron storage portion of a non-volatile memory (especially, single electron transistor memory). In the non-volatile memory, if a ferrorlectric material is used for a capacitor portion, a writing operation is carried out by a polarization switch. Accordingly, an operation speed becomes very high (several nanoseconds). Moreover, since no high electric fields are necessary for the tunneling of electrons through the barrier layer, the use of the ferroelectric material is very advantageous for reducing power consumption and enhancing durability.

In accordance with a first means for solution of the invention, a non-volatile memory is provided, comprising:
a gate;
a ferroelectric layer disposed on the gate; and
an island electrode disposed on the ferroelectric layer, held
between a source and a drain by interpolating insulating layers
between the island and each of the source and the drain, and electrically connected to the gate.

In accordance with a second means for solution of the invention, a non-volatile memory is provided, comprising:
a gate;
a ferroelectric layer disposed on the gate;
a Low-k layer disposed on the ferroelectric layer; and
an island electrode disposed on the Low-k layer, held between a source and a drain by interpolating insulating layers between the island electrode and each of the source and the drain, and electrically connected to the gate.

In accordance with a third means for solution of the invention, a non-volatile memory is provided, comprising:
a gate;
a ferroelectric layer disposed on the gate;
an upper gate disposed on the ferroelectric layer;
a Low-k layer disposed on the ferroelectric layer;
an island electrode disposed on the Low-k layer, held between a source and a drain by interpolating insulating layers between the island electrode and each of the source and the drain, and electrically connected to the gate.

DESCRIPTION OF THE PREFERED EMBODYMENT

(1) Basic Constitution of the Invention

Figure 1:
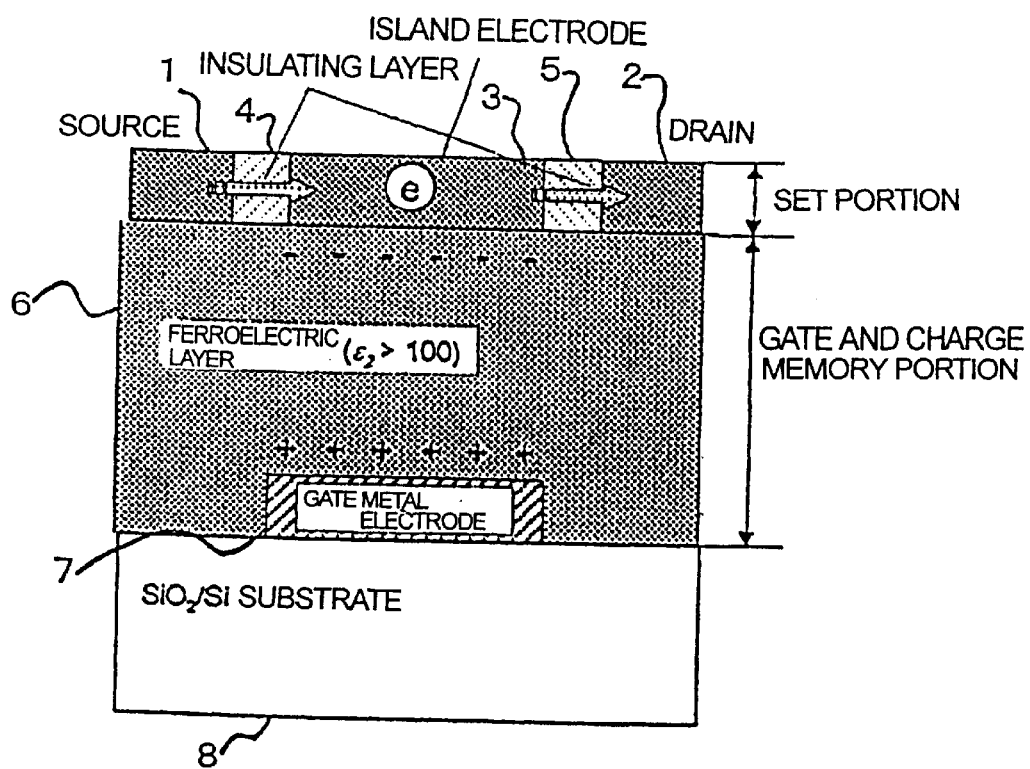
FIG. 1 is a sectional view illustrating an operation principle of a ferroelectric single electron transistor memory according to the invention.

FIG. 1 is sectional view illustrating the operation principle of a ferroelectric single electron transistor memory according to the invention. This device comprises a source 1, a drain 2, an island electrode 3, insulating layers 4 and 5, a ferroelectric layer 6, a gate 7 and a substrate 8.

When a predetermined bias voltage is applied between the source 1 and the drain 2 (to change a gate voltage), a current discretely flows between the source 1 and the drain 2 in accordance with quantized electrostatic energy levels in the island electrode 3 having a size of several 10 nm or lower. The switching ON/OFF of the current between the source 1 and the drain 2 in this case can be carried out by applying ½-electron charge (referred to as e/2, hereinafter) to the gate 7. A single electron transistor has high current sensitivity. When the gate voltage induces polarization in the ferroelectric layer 6, its electric field is applied to the island electrode 3. The current between the source 1 and the drain 2 in this case can be measured with high sensitivity by the operation of the single electron. Charge holding can be carried out by the polarization in the ferroelectric layer 6, and the retention can be held even if a power supply is cut off. In addition, the polarization direction of the ferroelectric layer 6 can be determined based on the size of the current between the source 1 and the drain 2.

(2) First Embodiment

Figure 2:
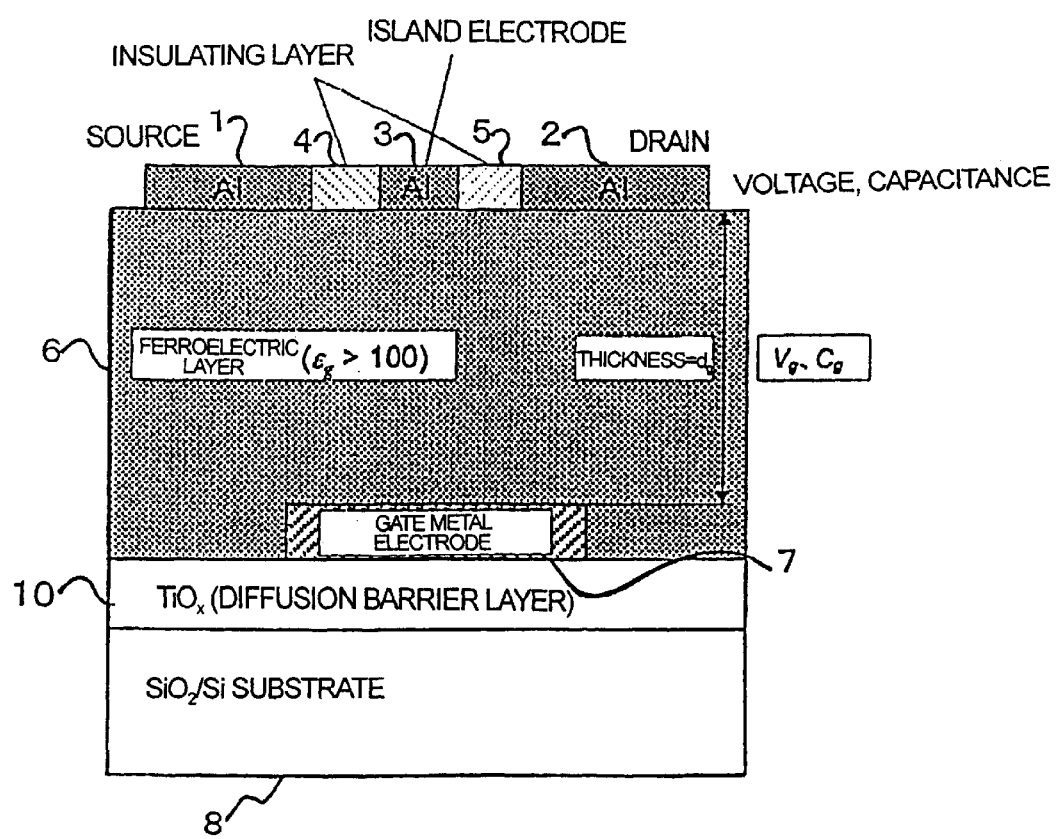
FIG. 2 is a sectional view of a ferroelectric single electron transistor memory according to a first embodiment of the invention.

FIG. 2 is a sectional view of a ferroelectric single electron transistor memory according to the first embodiment of the invention. This memory comprises: a diffusion barrier layer 10 formed on the substrate 8; the gate 7 formed on the diffusion barrier layer 10; the ferroelectric layer 6 formed on the gate 7 and the diffusion barrier layer 10; the source 1 and the drain 2 formed on the ferroelectric layer 6; an island electrode 3 formed between the source 1 and the drain 2; the insulating layer 4 between the island electrode 3 and the source 1; and the insulating layer 5 between the island electrode 3 and the drain 2.

The island electrode 3, the source 1 and the drain 2 can be made of, e.g., Al or Ti. Each of the source 1 and the drain 2 can be made of, e.g., metal having a width and a thickness of about several ten nm. The island electrode 3 can be formed to have size of, e.g., several ten nm or lower. The insulating layers 4 and 5 can be made of, e.g., Al oxide or Ti oxide. The island electrode 3, the source 1, and the drain 2, which are made of Al and constitute the single electron transistor, are formed on the same plane. The ferroelectric layer 6 can be made of one selected from, e.g., $PbTiO_3$, $PbZr_xTi_{1-x}O_3$, $(Pb, Sr)\ TiO_3$, $(Pb_{1-y}Sr_y)(Ti_{1-x})Zr_xO_3$, $SrBi_2Ta_2O_9$ $BaTiO_3$, $Bi_3Ti_4O_{12}$, $LiNbO_3$, $SrBi_2Ta_xNb_{1-x}O_9$. The ferroelectric layer 6 has, for example, a dielectric constant $\in > 100$. In this example, the ferroelectric layer 6 is brought into contact with the areas of the island electrode 3, the source 1 and the drain 2, and with the gate 7 and the diffusion barrier layer 10 around the gate 7.

The gate 7 is made of, e.g., Pt or $PhO_x$, disposed below the ferroelectric layer 6, and controls the entry/exit of electrons into/from the island electrode 3. The gate 7 can have a thickness set substantially equal to 50 nm or lower. The gate 7 is disposed on the diffusion barrier layer 10 formed on the substrate. When a gate potential is applied, charges are also stored in the island electrode 3 by the gate potential. Thus, a normal single electron transistor can be provided with another gate for canceling such induced charges. The diffusion barrier layer 10 can be made of, e.g., $TiO_x$ having a thickness set substantially equal to 20 nm or higher.

Figure 3:
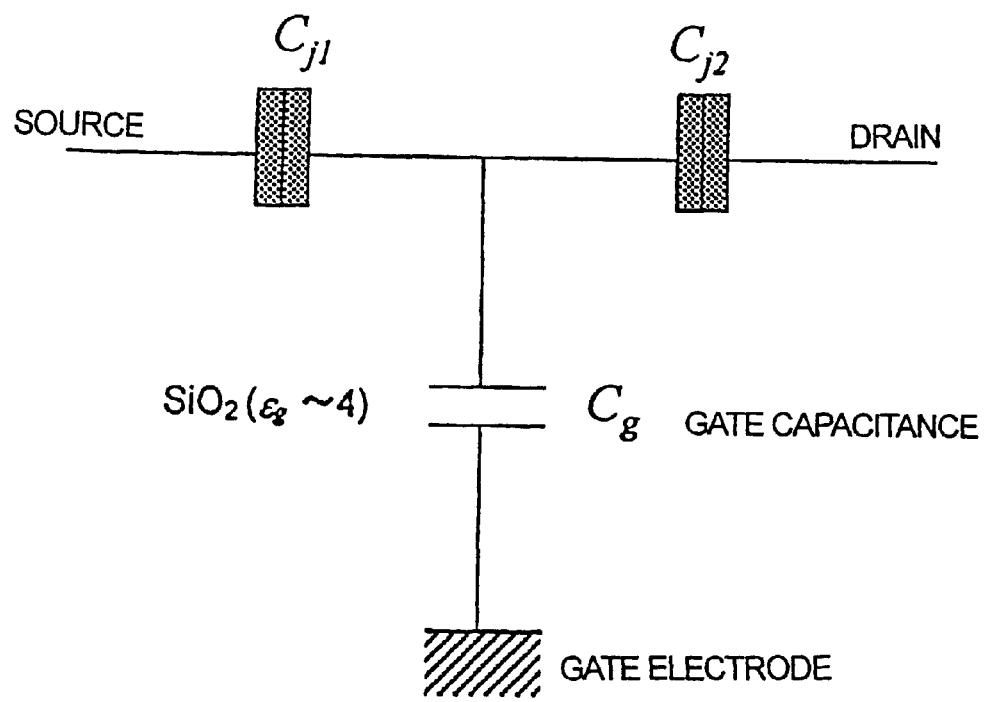
FIG. 3 is a view showing an equivalent circuit of the ferroelectric single electron transistor memory according to the first embodiment of the invention.

FIG. 3 shows the equivalent circuit of the ferroelectric single electron transistor according to the first embodiment of the invention. As a gate voltage is directly applied to the ferroelectric layer 6, a thickness of the gate layer is decided under the following conditions, by considering only the ferroelectric layer 6.

(a) A gate voltage $V_g$ applied through the ferroelectric layer 6 should exceed a minimum potential necessary for polarization inside a ferroelectric layer. In the described case, this minimum potential is estimated by assuming that a coercive electric field of the ferroelectric layer is $(E_c)=50$ kV/cm. A condition for this is as follows:

$$V_g > E_c \times \text{thickness } (d_g)$$

From the thickness $d_g$, a minimum necessary value of $V_g$ is given by the product of $E_c$ and $d_g$, If only this condition applies, a gate voltage is lowered by reducing the thickness as much as possible, making it possible to reduce power consumption. However, consideration must be given to the following condition in the device process.

(b) Because of limitations on thin film growth, a minimum thickness should be set as follows:

$$d_g > 1000 \text{ Å (e.g., in the case of } PbTiO_3 \text{ or } PbZr_xTi_{1-x}O_3)$$

$$d_g > 2000 \text{ Å (e.g., in the case of } SrBi_2Ta_2O_9 = SBT)$$

Thus, gate voltages to be expected are low potentials of, i.e., 0.5 V with 1000 Å, and 1.0 V with 2000 Å. However, in the described embodiment, a gate capacitance is increased, e.g., $C_g \sim 1300$ aF in the case of $PbTiO_3$ ($\in \sim 500$), and $C_g \sim 500$ aF in the case of SBT ($\in \sim 200$). It is larger by 3 digits or more compared with the gate capacitance $\sim 10^{-1}$ aF or lower of the conventional metal contacted single electron transistor (see Jpn. J. Appl. Phys. 35, L1465, 1996, by Nakamura et al.). An operation limit temperature of the single electron transistor is obtained by the, following:

$$kT=e^2/2C$$

Accordingly, with the above gate capacitance, an operation temperature of mK or lower is necessary for the reading operation of the single electron transistor. (The symbol '∼' means the symbol '≈'.)

(3) Second Embodiment

Figure 4:
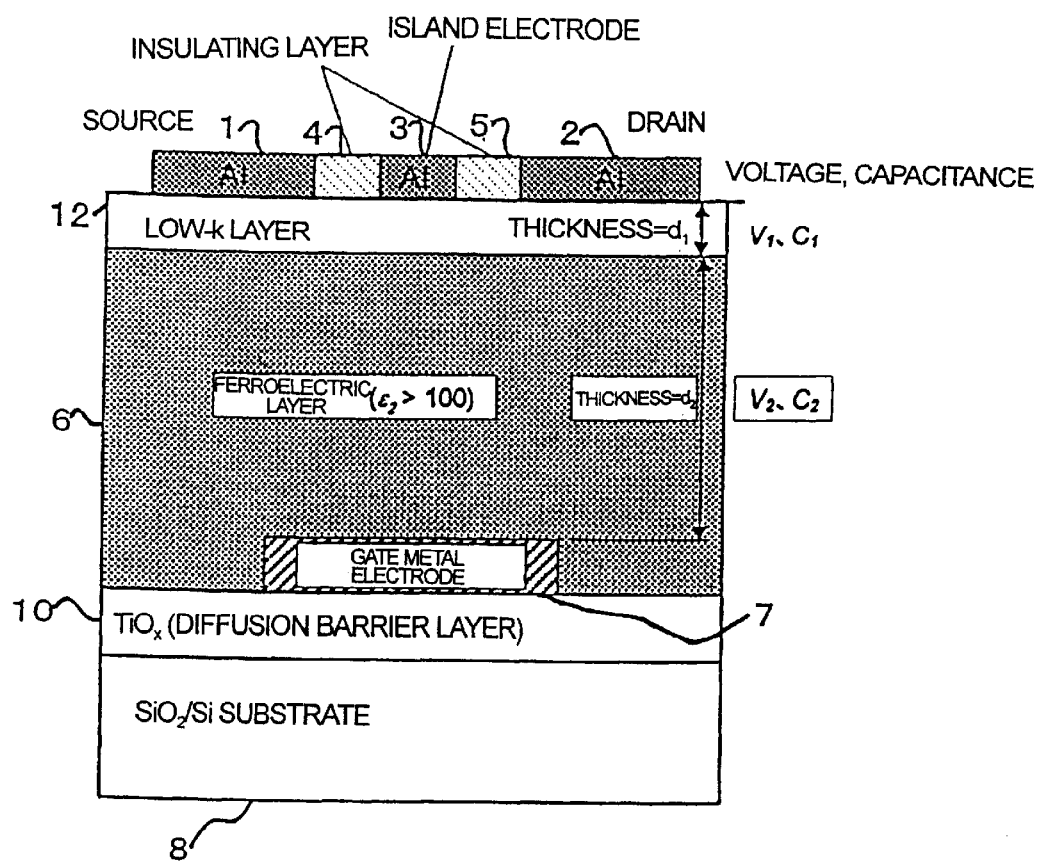
FIG. 4 is a sectional view of a ferroelectric single electron transistor memory according to a second embodiment of the invention.

FIG. 4 is a sectional view showing a ferrorlectric single electron transistor memory according to the second embodiment of the invention. This memory comprises: the diffusion barrier layer 10 formed on the substrate; a gate 7 formed on the diffusion barrier layer 10; the ferroelectric layer 6 formed on the gate and the diffusion barrier layer 10; a Low-k layer 12 formed on the ferroelectric layer 6; the source 1 and the drain 2 formed on the Low-k layer 12; the island electrode 3 formed between the source 1 and the drain 2; the insulating layer 4 between the island electrode 3 and the source. 1; and the insulating layer 5 between the island electrode 3 and the drain 2.

The Low-k layer 12 can be made of, e.g., $SiO_2$ or $Si_3N_4$. The role of the Low-k layer 12 (e.g., $SiO_2$ of ∈∼4) is to screen the increase of the gate capacitance caused by a high dielectric constant of the ferroelectric film, reduce a capacity component due to the line of electric fileds leaked from the island electrode 3 as much as possible and prevent a reduction in the operation limit temperature of $(kT=e^2/2C)$ of the single electron transistor. Other components are similar to those of the first embodiment.

Generally, grains of micron size are easily generated in a ferroelectric layer. On the other hand, single crystallization easily occurs on a flat metal film. If step coverage is present on the substrate in the formation of the ferroelectric layer as shown in FIG. 4, because of these characteristics, grains may be generated only on the gate metal electrode by single crystallization, and a layer showing no ferroelectric characteristic may be formed on the diffusion barrier layer other than the gate metal electrode due to pyrochlore phase crystallization. Thus, since only the grain portion of the ferroelectric layer on the gate metal electrode is subjected to polarization, when integration can be carried out, adjacent devices can be separated in a size of the gate metal electrode as a device unit, thereby enabling scale down and integration.

(4) Third Embodiment

Figure 5:
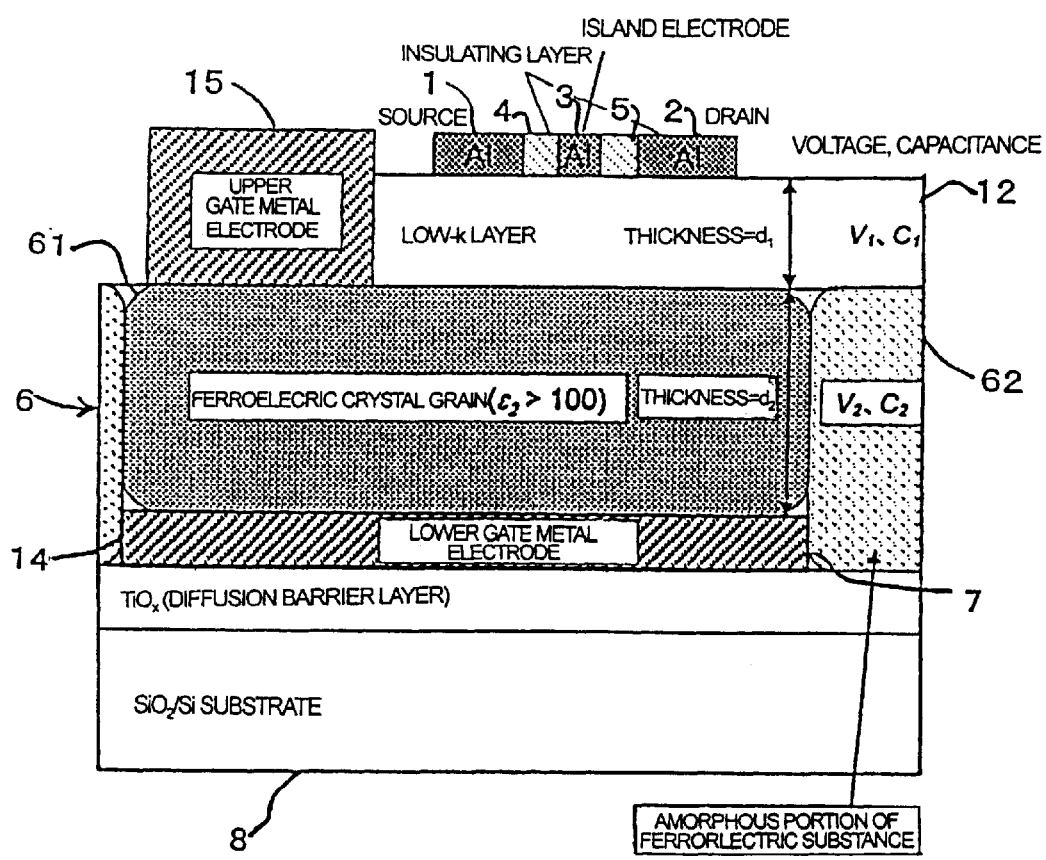
FIG. 5 is a sectional view of a ferroelectric single electron transistor memory according to a third embodiment of the invention.

FIG. 5 is a sectional view showing a ferroelectric single transistor memory according to the third embodiment of the invention. This memory comprises: the diffusion barrier layer formed on a substrate; a lower gate metal electrode 14 formed on the diffusion barrier layer 10; the ferroelectric layer 6 formed on the lower gate metal electrode 14 and the diffusion barrier layer 10; the Low-k layer 12 formed on the ferroelectric layer 6; an upper gate metal electrode 15 formed on the ferroelectric layer 6; the source 1 and the drain 2 formed on the Low-k layer 12; the island electrode 3 formed between the source 1 and the drain 2; the insulating layer 4 between the island electrode 3 and the source 1; and the insulating layer 5 between the island electrode 3 and the drain 2.

A difference from the second embodiment is that the upper and lower gate metal electrodes 15 and 14 made of Pt or the like are disposed on and below the ferroelectric layer 6 respectively. The role of the Low-k layer 12 (e.g., $SiO_2$ of ∈∼4) is to screen the increase of a gate capacity caused by a high dielectric constant of the ferroelectric film, reduce a capacity component due to the line of electric force leaked from the island electrode 3 as much as possible, and prevent a reduction in the operation limit temperature $(kT=e^2/2C)$ of the single electron transistor. In addition, the ferroelectric layer 6 includes a perovskite phase portion 61 and a pyrochlore phase portion 62.

According to the second embodiment, a single crystal grain on the lower gate electrode is correlated to one single electron transistor device, and a writing operation is performed by inducing polarization in the ferroelectric layer only by the lower gate electrode. In practice, however, it is not always easy to control the shape of a grain size only based on the shape of the lower gate electrode, and variance occurs in the grain size and a boundary of the grains. Consequently, a writing error may occur because of an ununiform electric field distribution during writing. Therefore, according to the third embodiment, in order to more effectively specify the area of storing electrons directly below an optional single electron transistor device, the upper gate metal electrode 15 is newly added, only the perovskite phase portion 61 of the ferroelectric layer 6 held between the upper and lower gate metal electrodes 15 and 14 is subjected to polarization, and then a writing operation is carried out. As a result, even if the ferroelectric grain size or its boundary is slightly changed, an electric field distribution can be more concentrated, and polarization limited to the area directly below the single electron transistor can be induced more accurately. Thus, it is possible to further enhance device separation, and suppress an erroneous operation when integration is carried out.

(5) Method for Deciding Thickness and Material for Gate Layer

A material to be selected and a thickness to be set for the ferroelectric layer 6 should be decided based on the following consideration for both second and third embodiments.

Figure 6:
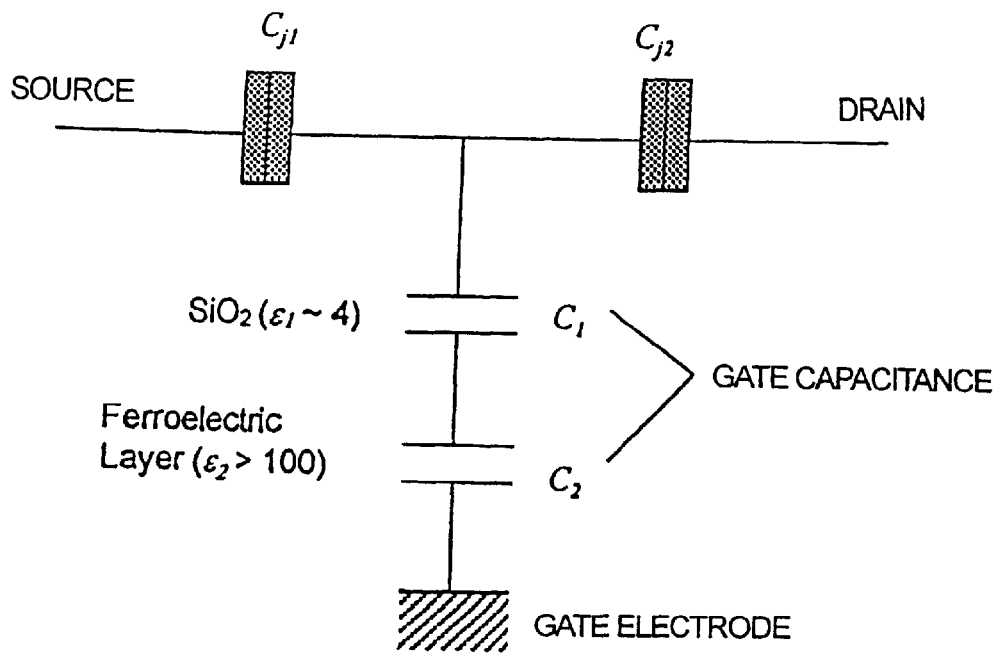
FIG. 6 is a view showing an equivalent circuit of the ferroelectric single electron transistor memory according to the second or third embodiment of the invention.

FIG. 6 shows the equivalent circuit of the ferroelectric single electron transistor memory according to each of the second and third embodiments. In other words, FIG. 6 shows the equivalent circuit shown in each of FIGS. 4 and 5. Here, a capacity between each electrode of the source 1 and the drain 2 and a ground is ignored, and only a gate capacity is considered. The equivalent circuit is characterized in that two series capacitors $(C_1, C_2)$ are provided between the gate 7 and the island electrode 3. Conditions for deciding thickness $(d_1, d_2)$ are described below.

(a) In a gate voltage $V_g$ $(=V_1+V_2)$ applied through the capacitors $C_1$ and $C_2$, $V_2$ should exceed a minimum potential necessary for polarization in the ferroelectric layer 6. In the described case, this minimum potential is estimated by assuming that a coercive electric field of the ferroelectric layer is $(E_c)=50$ kV/cm. A condition for this is as follows:

$$V_2 > E_c \times \text{thickness } (d_2)$$

From the thickness $(d_2)$, a minimum necessary value of $V_2$ is given by $E_c d_2$.

(b) Because of limitations on thin film growth, a minimum thickness should be set as follows:

$$d_2 > 1000 \text{ Å (in the case of PbTiO}_3 \text{ or PbZr}_x\text{Ti}_{1-x}\text{O}_3)$$

$$d_2 > 2000 \text{ Å (in the case of SrBi}_2\text{Ta}_2\text{O}_9=\text{SBT)}$$

$d_1 > 100$ Å (equal to/higher than natural oxidized film thickness of SiO$_2$)

Under these conditions, a combination of $d_1$ and $d_2$ for setting $V_1+V_2$ to be minimum is discovered. A gate voltage $V_g$ is as follows:

$$V_g = V_1 + V_2 = V_2(V_1/V_2 + 1)$$

Accordingly, calculation can be made based on $V_2$ given by the condition (a) and $V_1/V_2$ provided by the ratio of $C_1$ to $C_2$. From the dielectric constant and the thickness of each of $C_1$ and $C_2$, the following results:

$$V_g = E_c d_2(\in_2 d_2/\in_1 d_1 + 1) = E_c(\in_2 d_1/\in_1 + d_2) \quad (1)$$

In this case, $d_1$ and $d_2$ are selected based on the size of contribution to $V_g$ in the expression (1). From the size relation of dielectric constants ($\in_2 \gg \in_1$), (first term) $\gg$ (second term) is established in practice, and thus the contribution of $d_1$ is large. Thus, it is only necessary to reduce $d_1$. However, there is a limit to such a reduction because of a limitation imposed by the condition (b). When a practical combination of $d_1$, and $d_2$ is selected under the condition (b), conditions for setting $V_g$ obtained from the expression (1) being equal to/lower than 10 V as a practically proper range are as follows:

In the case of PbTiO$_x$($\in_2$~500), $V_g$=6.8 V with $d_1$=100 Å and $d_2$=1000 Å

In the case of SBT ($\in_1$~200), $V_g$=6.0 V with $d_1$=200 $\in$ and $d_2$=2000 Å

Under the foregoing thickness conditions, as rough estimation made when the island electrode 3 is assumed to be a point-charge, a gate capacitance of the island electrode 3 of the single electron transistor is 0.2 aF, charges stored during the coercive electric field application of the ferroelectric layer 6 are ~1.2 aC (=8e, in the case of SBT), and ~1.4 aC (=9e, in the case of PbTiO$_x$), and induced polarizations are 0.4 μC/cm$^2$ (in the case of SBT), and 0.5 μC/cm$^2$ (in the case of PbTiO$_x$). Thus, these values are not so deviated from those of the conventional single electron transistor (see Appl. Phys. Lett. 71, 2038, 1977 by Chen et al., or Jpn. J. Appl. Phys. 35, L 1465, 1996 by Nakamura and et al.) and the characteristics of the ferroelectric layer (see OYO BUTSURI, Vol. 67, No. 11, 1257, 1998 by Yasuhiro Umemoto, or Jpn. J. Appl. Phys. 34, 5233, 1995 by Mihara et al.), and are in a sufficiently operable range.

(6) Operation

Figure 7:
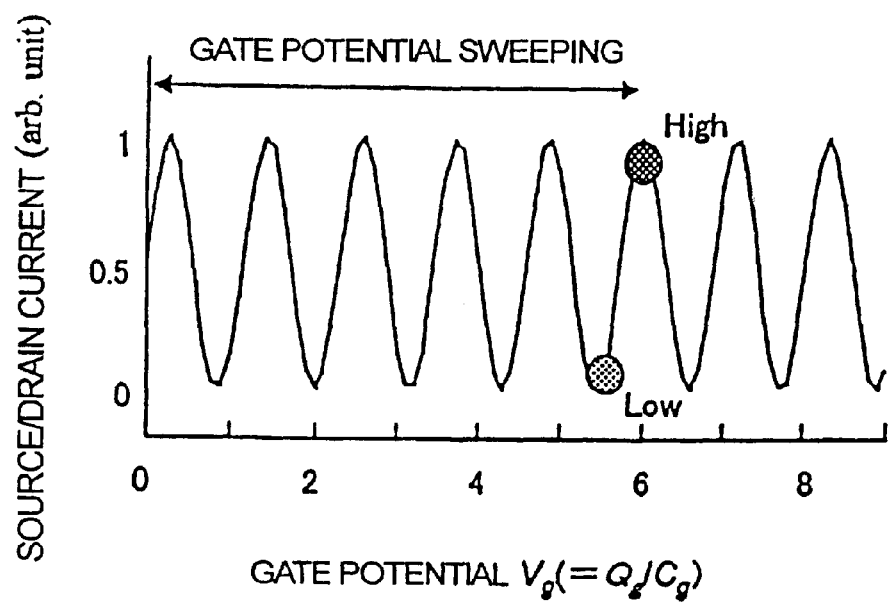
FIG. 7 is a view showing a current/voltage characteristic of the ferroelectric single electron transistor memory according to the invention.
Figure 8:
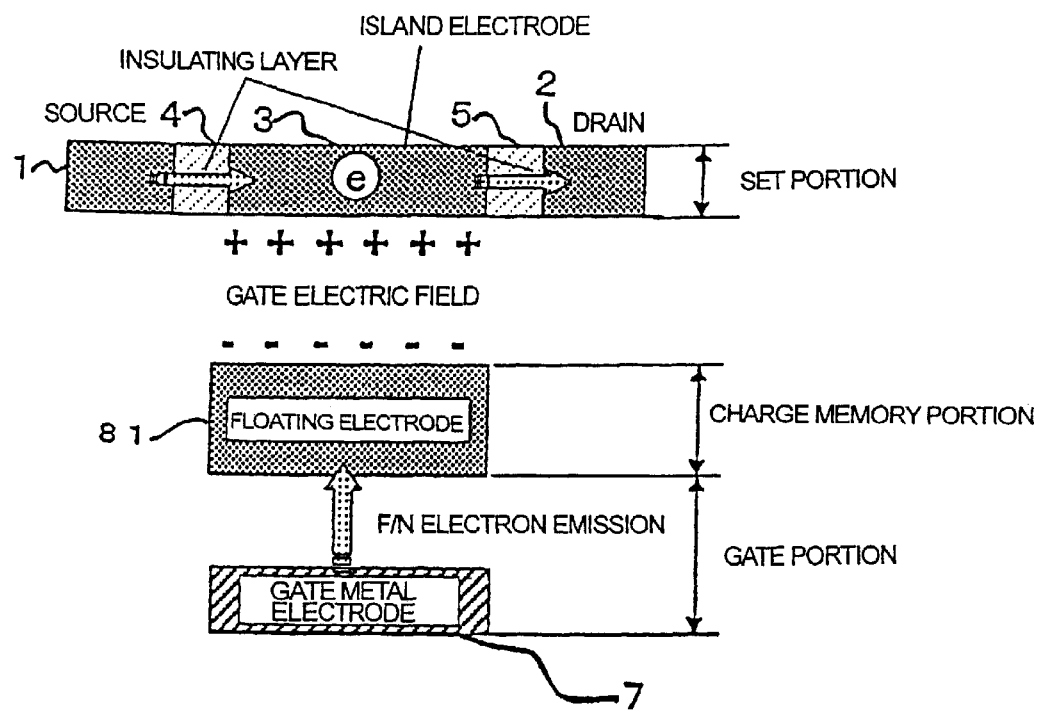
FIG. 8 is a sectional view showing a structure of a conventional single electron transistor memory.

Now, the memory operation of the device structure decided in the foregoing manner will be described. FIG. 7 shows the current/voltage characteristic of the ferroelectric single electron transistor memory of the invention. The operations of the first to third embodiments are basically similar.

A characteristic inherent to the single electron transistor is that a current between the source 1 and the drain 2 can be read based on a half of electron. In the single electron transistor, an electrostatic capacitance C is very small, and the number of digit of the electrostatic capacitance C approaches that of electron charges. When a gate voltage is fixed, a current/voltage characteristic between the source 1 and the drain 2 is stepped, and proportional and constant states are repeated to increase a current value. In this state, it cannot be determined whether reading based on the unit of electron is now being carried out or not. Accordingly, the gate voltage is changed. In this case, a potential between the source 1 and the drain 2 is maintained constant.

By changing a gate potential, a current between the source 1 and the drain 2 can be controlled. In other words, the gate potential can cause a current to flow between the source 1 and the drain 2 (High state in FIG. 7), and the gate potential can also prevent the flowing of current between the source 1 and the drain 2 (Low state in FIG. 7). The numbers of High and Low states are correspondent to quantized levels in the island electrode 3. In this way, by gate potential sweeping, High (on) and Low (off) sates are determined.

In the case of the invention, a voltage applied to the gate 7 causes gate sweeping to be carried out at a stretch up to a predetermined fixed potential by charges stored in the ferroelectric layer 6. However, in the case of the invention, destructive reading-out occurs, and no previous charges are stored after reading. Thus, charges can be stored (written) in the ferroelectric layer 6 by applying a new gate potential and maintained until next reading.

With regard to a specific writing operation, first, a voltage between the source 1 and the drain 2 is set equal to 0, and a voltage $V_g$ is then applied to the gate 7. When a potential V2 of the ferroelectric layer 6 is increased equal to a coercive electric field or more, polarization occurs in the ferroelectric layer 6, and generated internal charges $Q_g$ are stored (written) as non-volatile charges. According to the first embodiment, the electric field of the ferroelectric layer 6 is directly applied as a gate electric field to the island electrode 3, and a current between the source 1 and the drain 2 is controlled. On the other hand, according to each of the second and third embodiments, the amounts of internal charges $Q_g$ are equal between the ferroelectric layer 6 and the Low-k layer 12, the electric field of the Low-k layer 12 is directly applied as the gate electric field to the island electrode 3, and a current between the source 1 and the drain 2 is controlled.

Next, with regard to a specific reading operation, first, when a bias voltage is applied between the source 1 and the drain 2, electrons are tunneled through the insulating layers 4 and 5, and stored in the island electrode 3. Electrostatic potential energy by these stored charges is quantized in the island electrode 3 of an nm scale. Accordingly, a current $I_{sd}$ observed between the source 1 and the drain 2 is cyclically changed with respect to the gate potential by reflecting the quantized energy. The cyclical waveform of the current $I_{sd}$ between the source 1 and the drain 2 with respect to the gate potential becomes one like that shown in FIG. 7. Stored information 0 (Low) or 1 (High) can be read in accordance with the gate potential corresponding to the internal charges $Q_g$ induced during the writing operation. For the determination of 0 or 1, the number of read cycle peaks may be corresponded ) to 0 or 1. If a noise level is low, multiple values may be stored by corresponding to individual peaks. In this case, with a gate voltage=e/2C$_g$ equivalent in principle to "e/2" set as a minimum unit, the current $I_{sd}$ between the source 1 and the drain 2 can be measured, making it possible to carry out reading with high sensitivity.

An erasing operation is carried out by applying to a gate 7 a voltage reverse to the voltage thereto during the writing operation.

The single electron transistor memory has mainly been described. It should be understood, however, that the invention could be applied to other non-volatile memories.

INDUSTRIAL APPLICAPABILITY

According to the invention, as described above, a ferroelectric layer is used for the gate portion, and a device operation is realized, where the phenomenon of tunneling of charges through the insulating film is prevented. Thus, it is possible to achieve high device reliability, reduce power consumption, and realize a high-speed operation.

More specifically, the invention is advantageous in the following respects:

By using the polarization of the ferroelectric layer as memory writing/erasing means, a high-speed operation can be performed at the polarization response of an atomic order.

By using the single electron transistor for charge reading, an operation can be performed by very small charges and at low power consumption.

Since the necessity of tunneling a current through the gate insulating film is eliminated, high durability (mainly decided by the durability of the ferroelectric layer) can be provided, and a device size can be made very small.

By using the established semiconductor manufacturing method (3-layer resist and 3-angle Al deposition (see Jpn. J. Appl. Phys. 35, 1465 (1996) by Y. Nakamura et al.), or the like), the precise control of the insulating film (thickness direction/horizontal direction) is made unnecessary, and the quality of a deposited Al electrode is difficult to be affected by the layered surface. Accordingly, the manufacturing process can be facilitated and simplified compared with the Si ferroelectric memory process.

By providing the Low-k layer ($SiO_2$) as the gate layer structure, the increase of a gate capacity caused by the high dielectric constant of the ferroelectric film can be screened.

By using the growth of a ferroelectric layer on the lower gate metal electrode, the flatness/crystallinity of the ferroelectric layer can be enhanced.

By providing the diffusion barrier layer, the thermal diffusion of the ferroelectric component to Si can be prevented in the heat treatment process of the ferroelectric layer.

By employing the layered structure, the degree of device integration can be increased.

What is claimed is:

1. A non-volatile memory comprising:
   a single electron transistor having a gate, a ferroelectric layer on said gate, and an island electrode on said ferroelectric layer opposite said gate, said island electrode being held between a source and a drain by interpolating insulating layers that are between the island electrode and each of the source and the drain, said island electrode being electrically switched by a change of polarization of said ferroelectric layer caused by application of a charge as small as ½ electron to said gate.

2. A non-volatile memory comprising:
   a gate;
   a ferroelectric layer disposed on said gate;
   a Low-k layer disposed on said ferroelectric layer; and
   an island electrode disposed on said Low-k layer, held between a source and a drain by interpolating insulating layers between the island electrode and each of the source and the drain, and electrically connected to said gate.

3. A non-volatile memory comprising:
   a gate;
   a ferroelectric layer disposed on said gate;
   an upper gate disposed on said ferroelectric layer;
   a Low-k layer disposed on said ferroelectric layer; and
   an island electrode disposed on said Low-k layer, held between a source and a drain by interpolating insulating layers between the island electrode and each of the source and the drain, and electrically connected to said gate.

4. A non-volatile memory according to claim 3, wherein said ferroelectric layer includes a perovskite phase portion formed on said gate, and a pyrochlore phase portion formed on a portion other than said gate.

5. A non-volatile memory according to claim 1, further comprising a diffusion barrier layer formed on a substrate, wherein said gate is disposed on said diffusion layer.

6. A non-volatile memory according to claim 5, wherein said diffusion barrier layer has a $TiO_x$ film thickness substantially set equal to 20 nm, alternatively higher.

7. A non-volatile memory according to claim 1, wherein said gate is made of one selected from Pt and $RhO_x$.

8. A non-volatile memory according to claim 1, wherein said ferroelectric layer is made of one selected from $PbTiO_3$, $PbZr_xTi_{1-x}O_3$, $(Pb,Sr)TiO_3$, $(Pb_{1-y}Sr_y)(Ti_{1-})Zr_xO_3$, $SrBi_2Ta_2O_9$, $BaTiO_3$, $Bi_3Ti_4O_{12}$, $LiNbO_3$, and $SrBi_2Ta_xNb_{1-x}O_9$.

9. A non-volatile memory according to claim 2, wherein said Low-k layer is made of one selected from $SiO_2$ and $Si_3N_4$.

10. A non-volatile memory according to claim 2, wherein said ferroelectric layer is made of one selected from $PbZr_xT_{1-x}$, and $(Pb_{1-y}Sr_y)(Ti_{1-x})ZrxO_3$, and has a thickness set substantially equal to about 100 nm, and said Low-k layer is made of one selected from $SiO_2$ and $Si_3N_4$, and has a thickness set substantially equal to 10 nm, alternatively lower.

11. A non-volatile memory according to claim 2, wherein said ferroelectric layer is made of $SrBi_2Ta_2O_9$, and has a thickness set substantially equal to about 200 nm, and said Low-k layer is made of one selected from $SiO_2$ and $Si_3N_4$, and has a thickness set substantially equal to 20 nm, alternatively lower.

12. A non-volatile memory according to claim 1, wherein said island electrode, said source and said drain are made of one of Al and Ti.

13. A non-volatile memory according to claim 1, wherein said ferroelectric layer is brought into contact with said island electrode, said source and said drain and with said gate and said diffusion barrier layer around said gate.

14. A non-volatile memory according to claim 2, further comprising a diffusion barrier layer formed on a substrate, wherein said gate is disposed on said diffusion layer.

15. A non-volatile memory according to claim 14, wherein said diffusion barrier layer has a $TiO_x$ film thickness substantially set equal to 20 nm, alternatively higher.

16. A non-volatile memory according to claim 2, wherein said gate is made of one selected from Pt and $Rho_x$.

17. A non-volatile memory according to claim 2, wherein said ferroelectric layer is made of one selected from $PbTiO_3$, $PbZr_xTi_{1-x}O_3$, $(Pb,Sr)TiO_3$, $(Pb_{1-y}Sr_y)(Ti_{1-x})Zr_xO_3$, $SrBi_2Ta_2O_9$, $BaTiO_3$, $Bi_3Ti_4O_{12}$, $LiNbO_3$, and $SrBi_2Ta_xNb_{1-x}O_9$.

18. A non-volatile memory according to claim 2, wherein said island electrode, said source and said drain are made of one of Al and Ti.

19. A non-volatile memory according to claim 2, wherein said ferroelectric layer is brought into contact with said island electrode, said source and said drain and with said gate and said diffusion barrier layer around said gate.

20. A non-volatile memory according to claim 3, further comprising a diffusion barrier layer formed on a substrate, wherein said gate is disposed on said diffusion layer.

21. A non-volatile memory according to claim 20, wherein said diffusion barrier layer has a $TiO_x$ film thickness substantially set equal to 20 nm, alternatively higher.

22. A non-volatile memory according to claim 3, wherein said gate is made of one selected from Pt and $Rho_x$.

23. A non-volatile memory according to claim 3, wherein said ferroelectric layer is made of one selected from $PbTiO_3$, $PbZr_xTi_{1-x}O_3$, $(Pb,Sr)TiO_3$, $(Pb_{1-y}Sr_y)(Ti_{1-x})Zr_xO_3$, $SrBi_2Ta_2O_9$, $BaTiO_3$, $Bi_3Ti_4O_{12}$, $LiNbO_3$, and $SrBi_2Ta_xNb_{1-x}O_9$.

24. A non-volatile memory according to claim 3, wherein said Low-k layer is made of one selected from $SiO_2$ and $Si_3N_4$.

25. A non-volatile memory according to claim 3, wherein said ferroelectric layer is made of one selected from $PbZr_xT_{1-x}$, and $(Pb_{1-y}Sr_y)(Ti_{1-x})ZrxO_3$, and has a thickness set substantially equal to about 100 nm, and said Low-k layer is made of one selected from $SiO_2$ and $Si_3N_4$, and has a thickness set substantially equal to 10 nm, alternatively lower.

26. A non-volatile memory according to claim 3, wherein said ferroelectric layer is made of $SrBi_2Ta_2O_9$, and has a thickness set substantially equal to about 200 nm, and said Low-k layer is made of one selected from $SiO_2$ and $Si_3N_4$, and has a thickness set substantially equal to 20 nm, alternatively lower.

27. A non-volatile memory according to claim 3, wherein said island electrode, said source and said drain are made of Al, alternatively Ti.

28. A non-volatile memory according to claim 3, wherein said ferroelectric layer is brought into contact with said island electrode, said source and said drain and with said gate and said diffusion barrier layer around said gate.

29. The non-volatile memory of claim 1, further comprising a Low-k layer between said island electrode and said ferroelectric layer.

30. The non-volatile memory of claim 29, further comprising an upper gate directly on said ferroelectric layer adjacent to said Low-k layer.

* * * * *